United States Patent
Biradar et al.

(10) Patent No.: US 11,289,495 B1
(45) Date of Patent: Mar. 29, 2022

(54) STATIC RANDOM ACCESS MEMORY (SRAM) BIT CELL CIRCUITS WITH A MINIMUM DISTANCE BETWEEN A STORAGE CIRCUIT ACTIVE REGION AND A READ PORT CIRCUIT ACTIVE REGION TO REDUCE AREA AND SRAM BIT CELL ARRAY CIRCUITS

(71) Applicant: QUALCOMM Incorporated, San Diego, CA (US)

(72) Inventors: Rahul Biradar, Bangalore (IN); Sunil Sharma, Bangalore (IN); Channappa Desai, Haveri (IN); Sonia Ghosh, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/038,037

(22) Filed: Sep. 30, 2020

(51) Int. Cl.
| | | |
|---|---|---|
| *H01L 27/11* | (2006.01) | |
| *G11C 11/419* | (2006.01) | |
| *H01L 23/522* | (2006.01) | |
| *H01L 21/8238* | (2006.01) | |
| *H01L 27/092* | (2006.01) | |

(52) U.S. Cl.
CPC ........ *H01L 27/1104* (2013.01); *G11C 11/419* (2013.01); *H01L 21/823821* (2013.01); *H01L 23/5226* (2013.01); *H01L 27/0924* (2013.01); *H01L 27/1116* (2013.01)

(58) Field of Classification Search
CPC ............. H01L 27/1104; H01L 27/0924; H01L 27/1116; H01L 21/823821; H01L 23/5226; G11C 11/419

USPC ................................ 257/369, 368, 401, 288
See application file for complete search history.

(56) References Cited

U.S. PATENT DOCUMENTS

| | | | |
|---|---|---|---|
| 10,109,646 B1* | 10/2018 | Badaroglu | .......... H01L 27/0924 |
| 2017/0338233 A1 | 11/2017 | Huang et al. | |
| 2018/0005691 A1 | 1/2018 | Liaw | |
| 2018/0181679 A1* | 6/2018 | Hong | ................... H01L 27/1104 |
| 2019/0006372 A1* | 1/2019 | Lu | ........................ H01L 29/1037 |
| 2019/0131309 A1 | 5/2019 | Liaw | |
| 2019/0198093 A1* | 6/2019 | Khellah | ................ G11C 11/418 |

(Continued)

OTHER PUBLICATIONS

International Search Report and Written Opinion—PCT/US2021/045198—ISA/EPO—dated Nov. 22, 2021.

*Primary Examiner* — Dao H Nguyen
(74) *Attorney, Agent, or Firm* — Qualcomm Incorporated

(57) ABSTRACT

SRAM cell circuits have a minimum distance between a storage circuit active region and a read port circuit active region to reduce area. SRAM cell circuits are formed in FinFETs in a storage circuit active area and a read port active area each including one or more diffusion regions of a substrate. Design rule constraints limit a minimum center-to-center distance between adjacent parallel fins. The SRAM bit cell has a reduced total area because a distance between the storage circuit active area and the read port active area is reduced to a minimum separation distance of between 1.0 and 2.15 times the smallest center-to-center distance between adjacent fins. Minimizing a separation distance may include relocating a gate contact of a write access transistor from a location between the storage circuit active region and the read port active region to a location overlapping the storage circuit active area.

21 Claims, 11 Drawing Sheets

(56) References Cited

U.S. PATENT DOCUMENTS

2020/0301668 A1\* 9/2020 Li ........................ G11C 11/419
2021/0375854 A1\* 12/2021 Liaw .................... G11C 11/412

\* cited by examiner

STATIC RANDOM ACCESS MEMORY (SRAM) BIT CELL CIRCUITS WITH A MINIMUM DISTANCE BETWEEN A STORAGE CIRCUIT ACTIVE REGION AND A READ PORT CIRCUIT ACTIVE REGION TO REDUCE AREA AND SRAM BIT CELL ARRAY CIRCUITS

BACKGROUND

I. Field of the Disclosure

The field of the disclosure relates generally to memory circuits in an integrated circuit and, more particularly, to reducing the area of memory circuits.

II. Background

Integrated circuit (IC) chips with processing circuits are indispensable to the functionalities of electronic devices. Processing circuits ("processors") read instructions and data from memory circuits for processing and store the processed data back into the memory circuits. Static random access memory (SRAM) is a type of memory circuit that can be employed in processors. SRAM contains a plurality of bit cells organized in rows and columns of an SRAM bit cell array in which each bit cell can store a single data value (bit) of digital data. Each bit cell includes a storage circuit and at least one access port for accessing the storage circuit. Accessing the storage circuit includes writing a data value into the storage circuit in response to a write operation and reading out the stored data value in response to a read operation. A processor issues write operations and read operations that control the access ports to access the storage circuit. Some bit cell circuits include one port for writing data into the storage circuit and another port for reading the stored data value out of the storage circuit. In some examples, a processing circuit can issue more than one read operation to an SRAM array, which can cause conflicts between overlapping read operations. In such examples, SRAM bit cell circuits in the SRAM array may employ multiple read ports in addition to a write port to avoid conflicting read operations. Each read port that is included in the SRAM bit cell circuit increases the size of the SRAM bit cell circuit and this increase is multiplied for each bit cell in a bit cell array.

SUMMARY OF THE DISCLOSURE

Aspects disclosed herein include static random access memory (SRAM) cell circuits with a minimum distance between a storage circuit active region and a read port circuit active region to reduce area. SRAM bit cell array circuits and related fabrication methods are also disclosed. SRAM bit cells are implemented as complementary metal oxide semiconductor (CMOS) circuits. Transistors of the CMOS circuits are provided as Fin Field-Effect Transistors (FETs) (FinFETs) formed in fins on a substrate, and an array of fins can be used to create an SRAM bit cell array circuit. Each SRAM bit cell circuit ("SRAM bit cell") in an SRAM bit cell array circuit includes a storage circuit and at least one read port circuit. FinFETs of the storage circuit are provided within a storage circuit active area. The storage circuit active area includes one or more diffusion regions of the substrate in which impurities have been diffused to form N-type and/or P-type materials. FinFETs of the read port circuit are provided in a read port active area that also includes one or more diffusion regions. Fins formed in the respective active areas extend parallel to each other in a first direction. Design rule constraints limit a center-to-center distance between adjacent parallel fins in a second direction, orthogonal to the first direction.

The exemplary SRAM bit cell disclosed herein has a reduced total area because a separation distance between the storage circuit active area and the read port active area is reduced. The separation distance is based on the minimum fin pitch, which is a smallest center-to-center distance between a fin and a nearest adjacent fin in a direction orthogonal to the first direction in which the fins extend. In one example, minimizing an active area separation distance includes relocating a gate contact of a write access transistor from a location between the storage circuit active region and the read port active region to a location overlapping the storage circuit active area. In the example, the gate contact is disposed in a first metal (M1) layer.

In this regard, in one aspect, a memory bit cell circuit is disclosed. The memory bit cell circuit includes a substrate. The memory bit cell circuit also includes a first plurality of fins extending in a first direction on the substrate. A smallest center-to-center distance from a first fin to a nearest adjacent fin of the first plurality of fins, in a second direction orthogonal to the first direction, is a minimum fin pitch. The memory bit cell circuit also includes a storage circuit configured to store a data value. The storage circuit includes a storage circuit active area of the substrate. The storage circuit active area includes a first subset of the first plurality of fins. The memory bit cell circuit also includes a read port circuit configured to read the data value from the storage circuit. The read port circuit includes a read port active area of the substrate. The read port active area includes a second subset of the first plurality of fins. The memory bit cell circuit also includes an inactive area between the storage circuit active area and the read port active area. A width of the inactive area in the second direction from the storage circuit active area to the read port active area is between 1.0 times and 2.15 times the minimum fin pitch.

In another aspect, a memory bit cell array circuit is disclosed. The memory bit cell array circuit includes a substrate. The memory bit cell array circuit also includes a first memory bit cell circuit. The first memory bit cell circuit includes a first plurality of fins extending in a first direction on the substrate. A smallest center-to-center distance from a first fin to a nearest adjacent fin of the first plurality of fins, in a second direction orthogonal to the first direction, is a minimum fin pitch. The first memory bit cell circuit also includes a first storage circuit configured to store a first data value. The first storage circuit includes a first storage circuit active area of the substrate. The first storage circuit active area includes a first subset of the first plurality of fins. The first memory bit cell circuit also includes a first read port circuit configured to read the first data value. The first read port circuit includes a first read port active area of the substrate. The first read port active area includes a second subset of the first plurality of fins. The first read port circuit is on a first side of the first storage circuit in the second direction. The memory bit cell array circuit also includes a second memory bit cell circuit. The second memory bit cell circuit includes a second plurality of fins extending in the first direction on the substrate. The second memory bit cell circuit also includes a second storage circuit configured to store a second data value. The second storage circuit includes a second storage circuit active area of the substrate. The second storage circuit active area includes a first subset of the second plurality of fins. The second memory bit cell circuit also includes a second read port circuit configured to read the second data value. The second read port circuit includes a second read port active area of the substrate. The second read port active area includes a second subset of the second plurality of fins. The second read port circuit is on a second side of the second storage circuit in the second direction. The memory bit cell array circuit also includes an inactive array area between the first read port circuit and the second read port circuit. A width of the inactive array area from the first read port active area to the second read port active area is between 1.0 times the minimum fin pitch and 2.15 times the minimum fin pitch.

In another aspect, a method of making a memory bit cell array circuit is disclosed. The method includes forming a substrate. The method also includes forming a first memory bit cell circuit. The first memory bit cell circuit includes a first plurality of fins extending in a first direction on the substrate. A smallest center-to-center distance from a first fin to a nearest adjacent fin of the first plurality of fins, in a second direction orthogonal to the first direction, is a minimum fin pitch. The first memory bit cell circuit also includes a first storage circuit configured to store a first data value. The first storage circuit includes a first storage circuit active area of the substrate. The first storage circuit active area includes a first subset of the first plurality of fins. The first memory bit cell circuit also includes a first read port circuit configured to read the first data value. The first read port circuit includes a first read port active area of the substrate. The first read port active area includes a second subset of the first plurality of fins. The first read port circuit is on a first side of the first storage circuit in the second direction. The method also includes forming a second memory bit cell circuit. The second memory bit cell circuit includes a second plurality of fins extending in the first direction on the substrate. The second memory bit cell circuit also includes a second storage circuit configured to store a second data value. The second storage circuit includes a second storage circuit active area of the substrate. The second storage circuit active area includes a first subset of the second plurality of tins. The second memory bit cell circuit also includes a second read port circuit configured to read the second data value. The second read port circuit includes a second read port active area of the substrate. The second read port active area includes a second subset of the second plurality of fins. The second read port circuit is on a second side of the second storage circuit in the second direction. The method also includes forming an inactive array area between the first read port circuit and the second read port circuit. A width of the inactive array area from the first read port active area to the second read port active area is between 1.0 times the minimum fin pitch and 2.15 times the minimum fin pitch.

DETAILED DESCRIPTION

Figure 1:
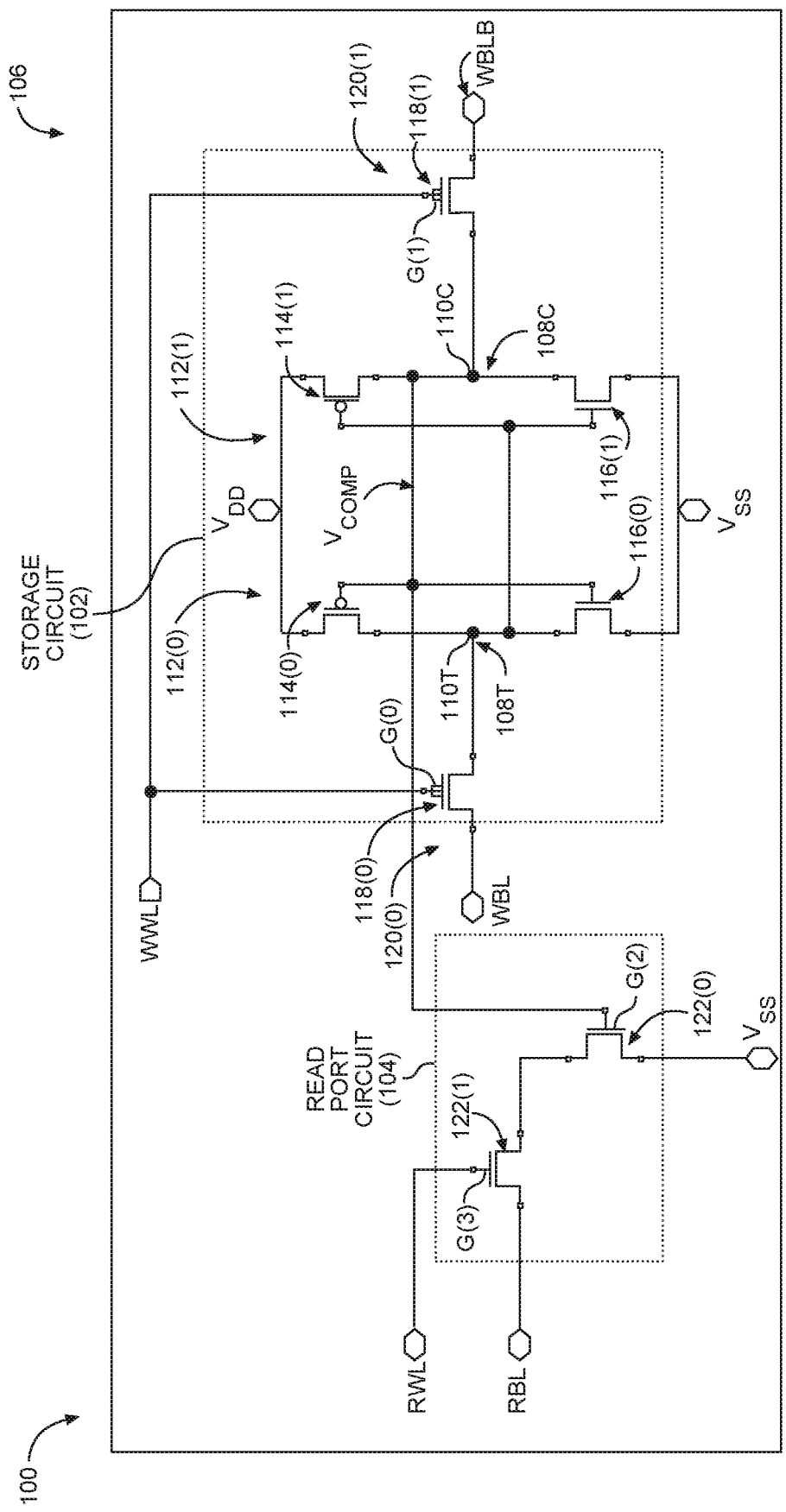
FIG. 1 is a circuit diagram of a static random access memory (SRAM) bit cell circuit including a six-transistor (6T) storage circuit and a two-transistor (2T) read port circuit.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein include static random access memory (SRAM) cell circuits with a minimum distance between a storage circuit active region and a read port circuit active region to reduce area. SRAM bit cell array circuits and related fabrication methods are also disclosed. SRAM bit cells are implemented as complementary metal oxide semiconductor (CMOS) circuits. Transistors of the CMOS circuits are provided as Fin Field-Effect Transistors (FETs) (Fin-FETs) formed in fins on a substrate, and an array of fins can be used to create an SRAM bit cell array circuit. Each SRAM bit cell circuit ("SRAM bit cell") in an SRAM bit cell array circuit includes a storage circuit and at least one read port circuit. FinFETs of the storage circuit are provided within a storage circuit active area. The storage circuit active area includes one or more diffusion regions of the substrate in which impurities have been diffused to form N-type and/or P-type materials. FinFETs of the read port circuit are provided in a read port active area that also includes one or more diffusion regions. Fins formed in the respective active areas extend parallel to each other in a first direction. Design rule constraints limit a minimum center-to-center distance between adjacent parallel fins in a second direction, orthogonal to the first direction.

The exemplary SRAM bit cell disclosed herein has a reduced total area because a separation between the storage circuit active area and the read port active area is reduced. The separation distance is based on the minimum fin pitch, which is a smallest center-to-center distance between a fin and a nearest adjacent fins in a direction orthogonal to the first direction in which the fins extend. In one example, minimizing an active area separation distance includes relocating a gate contact of a write access transistor from a location between the storage circuit active region and the read port active region to a location overlapping the storage circuit active area. In the example, the gate contact is disposed in a first metal (M1) layer.

Figure 2:
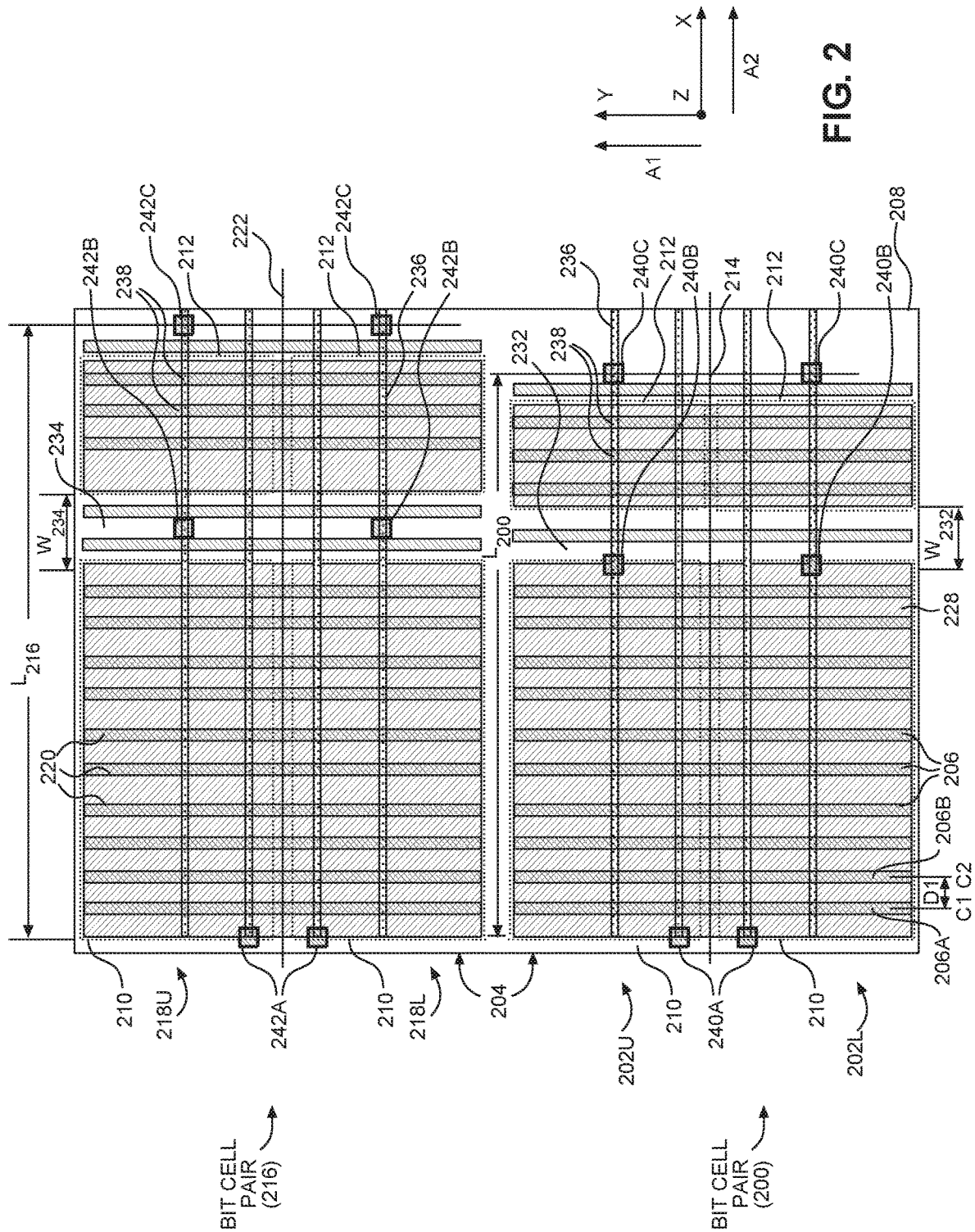
FIG. 2 is a top-down plan view comparing existing memory bit cell circuits with exemplary memory bit cell circuits such as the SRAM bit cell circuit of FIG. 1 including a minimized inactive bit cell area and gate contacts overlapping an active area of a storage circuit to reduce a bit cell circuit length.

A circuit diagram of an SRAM bit cell circuit 100 is shown in FIG. 1. Before discussing inventive aspects of a physical implementation of the SRAM bit cell circuit 100, as illustrated in FIG. 2, details of the SRAM bit cell circuit 100 and operation thereof are first presented. The SRAM bit cell circuit ("bit cell") 100 includes a six-transistor (6T) SRAM storage circuit 102 and a two-transistor (2T) read port circuit 104. The bit cell 100 is an example of a memory bit cell circuit 106. The 6T SRAM storage circuit ("storage circuit") 102 stores a true data value 108T at a true data node 110T and stores a complement data value 108C at a complement data node 110C. The storage circuit 102 includes cross-coupled inverters 112(0), 112(1) powered by supply voltage $V_{DD}$. The cross-coupled inverters 112(0), 112(1) reinforce each other to retain the true and complement data values 108T and 108C in the form of voltages on the true data node 110T and the complement data node 1100, respectively. Each cross-coupled inverter 112(0), 112(1) is comprised of a respective pull-up P-type FET (PFET) 114(0), 114(1) coupled in series to a respective pull-down N-type FET (NFET) 116(0), 116(1). NFET write access transistors 118(0), 118(1) are coupled to the respective cross-coupled inverters 112(0), 112(1) to provide respective combined write ports 120(0), 120(1) to the bit cell 100.

The NFET write access transistors 118(0), 118(1) control writing data into the bit cell 100 in a write operation. A voltage representing the true data value 108T provided on a write bit line ("WBL") is coupled to the true data node 110T in response to the supply voltage $V_{DD}$ being supplied from a write word line ("WWL") to a gate G(0) of the NFET write access transistor 118(0). A complement voltage representing the complement data value 108C provided on a complement write bit line ("WBLB") is coupled to the complement data node 110C in response to the supply voltage $V_{DD}$ being supplied from the WWL to a gate G(1) of the NFET write access transistor 118(1).

The read port circuit 104 includes NFETs 122(0), 122(1) which have their sources and drains coupled in series between a read bit line ("RBL") and a ground ($V_{SS}$). The complement data node 110C is coupled to a gate G(2) of the NFET 122(0), and a read word line ("RWL") is coupled to a gate G(3) of the NFET 122(1). In a read operation, the RBL is pre-charged to the supply voltage $V_{DD}$ (e.g., binary "1"). In response to the RWL being asserted to the supply voltage $V_{DD}$, the NFET 122(1) is turned on. The RBL will remain charged or will be discharged through the NFET 122(0) depending whether the voltage $V_{COMP}$ of the complement data node 110C turns on the NFET 122(0). In this regard, the voltage on the RBL will correspond to the true data value 108T.

FIG. 2 is top-down plan view of a bit cell pair 200 of exemplary bit cells 202L and 202U, which are each physical implementations of the bit cell 100 in FIG. 1. An understanding of the exemplary aspects disclosed herein is facilitated by the following explanation of the structure of the bit cell pair 200. Features of each of the bit cells 202L and 202U may be referred to according to the labels of the bit cell 100 in FIG. 1. In the bit cells 202L and 202U, the NFETs 116(0), 116(1), 122(0), 122(1), the NFET write access transistors 118(0), 118(1), and the PFETs 114(0), 114(1) are referred to collectively as FinFETs 204 and are not individually labeled in FIG. 2. The FinFETs 204 are formed in a plurality of fins 206 on a substrate 208. In this regard, FinFETs 204 in the storage circuit 102 are disposed in a storage circuit active area 210 of the substrate 208. FinFETs 204 in the read port circuit 104 are disposed in a read port active area 212 of the substrate 208.

To optimize layout area efficiency within the bit cell pair 200, the bit cell 202U is arranged to mirror the bit cell 202L across a mirror line 214. In this regard, the storage circuit active area 210 and the read port active area 212 of the bit cell 202U are arranged to mirror the storage circuit active area 210 and the read port active area 212 of bit cell 202L across the mirror line 214. Each of the storage circuits 102 is coupled to the read port circuit 104 on a corresponding side of the mirror line 214 to form the bit cells 202L and 202U.

FIG. 2 also includes a top-down plan view of a bit cell pair 216 including bit cells 218L and 218U. The bit cells 218L and 218U are also implementations of the bit cell 100 in another plurality of fins 220 of the substrate 208. Within the bit cell pair 216, the bit cells 218U and 218L each include the storage circuit active area 210 and the read port active area 212. The storage circuit active area 210 and the read port active area 212 of the bit cell 218U mirror the storage circuit active area 210 and the read port active area 212 of the bit cell 218L across a mirror line 222.

A difference between the bit cell pair 200 and the bit cell pair 216 in FIG. 2 is that a length $L_{200}$ of the bit cell pair 200 is less than a length $L_{216}$ of the bit cell pair 216, as explained below. For this reason, an area of the substrate 208 occupied by the bit cell pair 200 is reduced compared to the bit cell pair 216. Since the storage circuit active area 210 and the read port active area 212 are employed in each of the bit cells 202L, 202U, 218L, and 218U, the reduction in area is attributed to other aspects of the respective bit cell pairs. Descriptions of the storage circuit active area 210 and the read port active area 212 in the bit cell 202L are also applicable to e bit cells 202U, 218L, and 218U.

The PFETs 114(0), 114(1), the NFETs 116(0), 116(1) and the NFET write access transistors 118(0), 118(1) of the storage circuit 102 are implemented in a plurality of the fins 206 in the storage circuit active area 210 and the read port active area 212 in the substrate 208.

In this context, an active area is a region of a substrate in which impurities or dopants have been diffused into the substrate 208 to form P-type semiconductor materials and/or N-type semiconductor materials. For example, a substrate 208 formed of silicon may be doped with either a pentavalent impurity (e.g., phosphorous or arsenic) to form an N-type semiconductor material or doped with a trivalent impurity (e.g., boron or aluminum) to form a P-type semiconductor material. Therefore, in this example, the fins 206 are formed of N-type semiconductor material and/or P-type semiconductor material. An inactive area comprises a non-diffusion region of the substrate 208, in which impurities were not diffused to form either a P-type material or an N-type material.

The fins 206 extend parallel to each other in a first direction A1 corresponding to the Y axis in FIG. 2. Design rules for fabricating the fins 206 on the substrate 208 require a center-to-center distance D1 to be at least a minimum fin pitch $P_{MIN}$ (not shown), which is a smallest distance D1 allowed by design rules. The minimum fin pitch $P_{MIN}$ is measured in a second direction A2 that corresponds to the X-axis in FIG. 2 (i.e., orthogonal to the Y-axis). The distance D1 is measured from a center C1 of a first fin 206A to a center C2 of a nearest adjacent fin 206B in the second direction A2, FIG. 2 also includes an inactive area 232 between the storage circuit active area 210 and the read port active area 212. The inactive area 232 is an area in which the substrate 208 is not doped with impurities to form N-type or P-type semiconductor materials. The inactive area 232 may include at least one inactive fin. The inactive area 232 should not be less than a minimum width $W_{232}$ in the second direction A2 according to the design rules. The minimum width $W_{232}$ from an active area to another active area, such as a distance from the storage circuit active area 210 to the read port circuit area 212, is set as a multiple of the minimum allowed fin pitch $P_{MIN}$. The minimum width $W_{232}$ can be 1.0 to 2.15 times the minimum fin pitch $P_{MIN}$.

In contrast to the bit cell 202L, an inactive area 234 between the storage circuit active area 210 and the read port active area 212 in the bit cells 218L and 218U has a width $W_{234}$. The width $W_{234}$ of the inactive area 234 in the bit cell 218L is greater than the width $W_{232}$ and is greater than 2.15 times the minimum allowed fin pitch $P_{MIN}$. A difference between the width $W_{232}$ of the bit cell 202L and the width $W_{234}$ of the bit cell 218L creates a difference in the length $L_{200}$ of the bit cell pair 200 compared to the length $L_{216}$ of the bit cell pair 216. In this regard, the bit cell 202L occupies a reduced area of the substrate 208 compared to the bit cell 218L.

In another aspect, the top-down plan view in FIG. 2 illustrates gates (e.g., poly-crystalline silicon gates) 236 over channel regions 238 to control the FinFETs 204 in the bit cell pairs 200 and 216. FIG. 2 also illustrates gate contacts 240A-240C employed to couple the gates 236 of the bit cell 202L to metal layers (not shown) to provide connections outside the bit cell pair 200. The bit cell 218L in the bit cell pair 216 includes gate contacts 242A-242C corresponding to the gate contacts 240A-240C in the bit cell 202L. In the bit cell 218L, the gate contact 242B is located above the inactive area 234. However, an electrical connection between gate contact 242B and the conductive gate 236 can be located anywhere along the conductive gate 236. To allow the width $W_{232}$ of the inactive area 232 in the bit cell pair 200 to be smaller than the width $W_{234}$ of the inactive area 234 in the bit cell pair 216, the gate contact 240B in the bit cell 202L is not located entirely above the inactive area 232. Rather, the gate contact 240B of the bit cell 202L is located such that an area of the gate contact 240B at leak partially overlaps the storage circuit active area 210. In an example, the area of the gate contact 240B may entirely overlap (e.g., where all of the area of the gate contact 240B is directly above) the storage circuit active area 210. Locating the bit cell 202L in this manner enables the dimension $L_{200}$ of the bit cell pair 200 in the second direction A2 to be less than the dimension $L_{216}$ of the bit cell pair 216.

Figure 3:
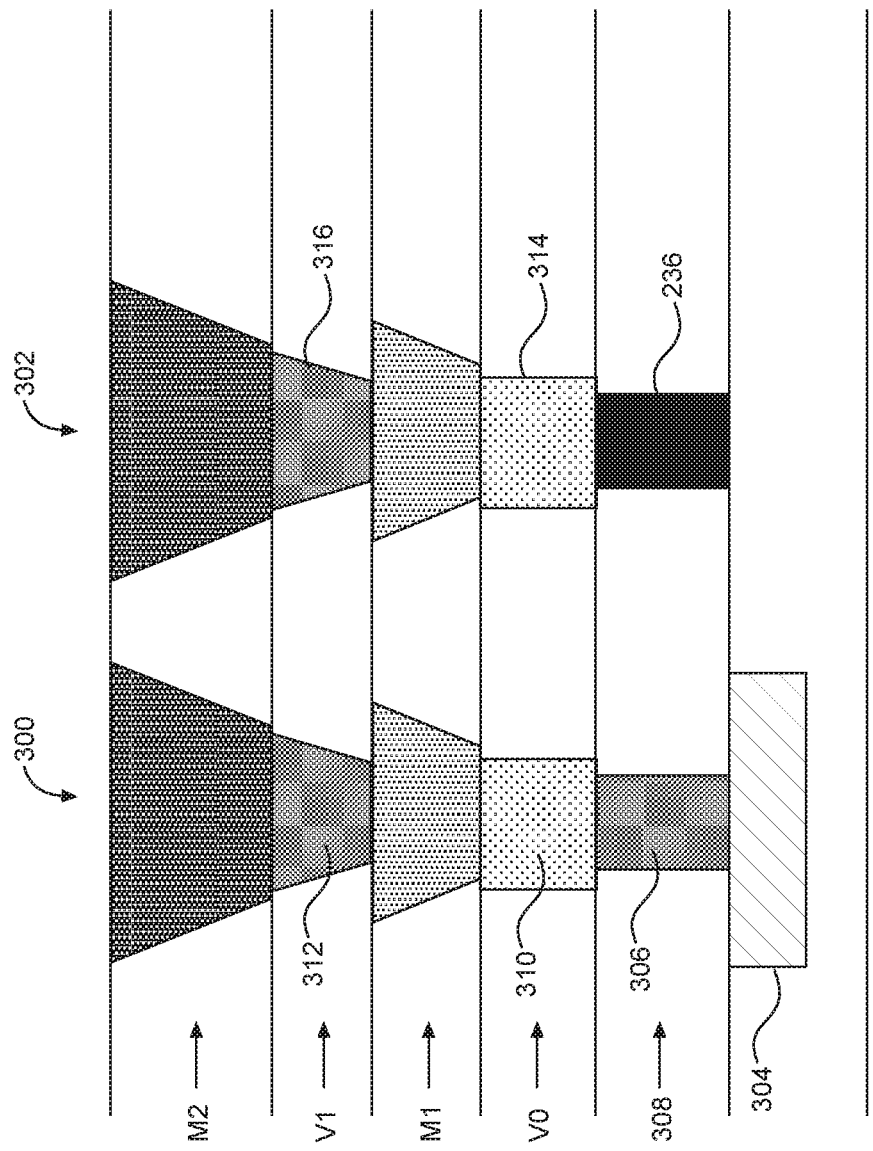
FIG. 3 is a cross-sectional side view of layers forming vertical interconnects to couple Fin Field-Effect Transistors (FETs) (FinFETs) to metal interconnect layers.

FIG. 3 is a cross-sectional side view of vertical interconnects 300 and 302 employed in the bit cell 202L in FIG. 2. The vertical interconnect 300 couples a source/drain terminal 304 of a FinFET 204 to a second metal (M2) layer. The vertical interconnect 300 includes a contact 306 in a first layer 308 corresponding to the gates 236. The contact 306 is disposed on the source/drain terminal 304. In a first vertical interconnect layer V0, a via 310 couples the contact 306 to the first metal (M1) layer. In a second vertical interconnect layer V1, a via 312 couples the M1 layer to the M2 layer.

In the vertical interconnect 302, a via 314 couples the gate 236 to the M1 layer. In the bit cell 218L in FIG. 2, the gate contact 242B is located on the gate 236 in the inactive area 234. However, in the bit cell 202L, the gate contact 240B is located above the gate 236 in an area that at least partially overlaps the storage circuit active area 210. The via 314 may be positioned over a channel region 238 or other section of the gate 236 within the storage circuit active area 210. Locating the vertical interconnect 302 on the gate 236 to overlap the storage circuit active area 210 allows the inactive area 232 of the bit cell 202L to be smaller than the inactive area 234 of the bit cell 218L. Referring back to FIG. 3, a via 316 in the second vertical interconnect layer V1 couples the M1 layer to the M2 layer. A vertical interconnect 302 may be used to couple the supply voltage $V_{DD}$ to the gates G(0) and G(1) of the NFET write access transistors 118(0) and 118(1) in the bit cell 100 in FIG. 1, and to couple the RWL to the gate G(3) of the NFET 122(1).

Figure 4:
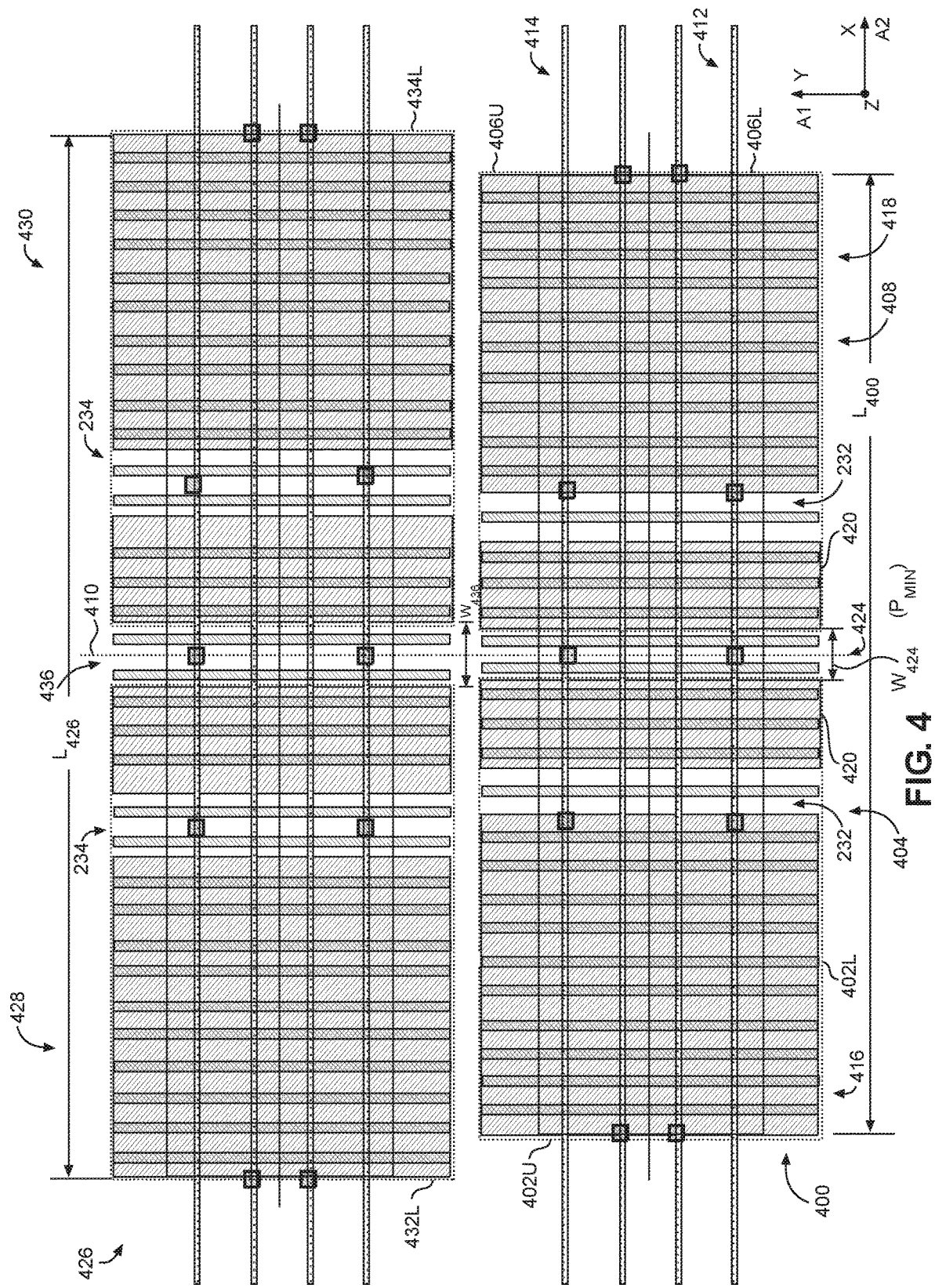
FIG. 4 is a top-down plan view of bit cell arrays of the memory bit cell circuits in FIG. 2 including minimized inactive bit cell areas and also including minimized inactive array areas to reduce array length.

FIG. 4 is a top-down plan view of an exemplary 2×2 SRAM bit cell array circuit ("2×2 array") 400 including bit cells 402L and 402U in a bit cell pair 404. The bit cell pair 404 corresponds to the bit cell pair 200 in FIG. 2. The 2×2 array 400 also includes bit cells 406L and 406U in a hit cell pair 408. The bit cell pair 408 mirrors the bit cell pair 404 across a mirror line 410 for optimized area efficiency of the 2×2 array 400. In other words, the storage circuits 102 and the read port circuits 104 of the bit cells 406L and 406U are located opposite to the storage circuits 102 and read port circuits 104 of the bit cells 402L and 402U with respect to the mirror line 410. For example, the read port circuit 104 of the bit cell 402L is on a first side of the storage circuit 102 in the second direction A2, and the read port circuit 104 of the bit cell 406L is on a second side of the storage circuit 102 in the second direction, with the mirror line 410 between the respective read port circuits 104. In the 2×2 array 400, a bottom row 412 of the 2×2 array 400 includes the bit cells 402L and 406L, and a top row 414 includes the bit cells 402U and 406U. A first column 416 of the 2×2 array 400 includes the bit cells 402L and 402U, and a second column 418 includes the bit cells 406L and 406U.

Read port active areas 420 of the bit cells 402L, 402U, 406L, and 406U correspond to the read port active areas 212 in FIG. 2. Design rules require an inactive array area 424 between the read port active areas 420 in the bit cell pair 404 and the read port active areas 420 in the bit cell pair 408. In addition, the minimum width $W_{424}$ from an active area to another active area, such as a distance between read port active areas 420, is set as a multiple of the minimum allowed fin pitch $P_{MIN}$. The design rules require a minimum width $W_{424}$ of the inactive array area 424 to be 1.0 to 2.15 times the minimum fin pitch $P_{MIN}$. In an example of the 2×2 array 400, the width $W_{424}$ of the inactive array area 424 is set to two times (2×) the minimum fin pitch $P_{MIN}$. In addition, since the bit cells 402L and 402U correspond to the bit cells 202L and 202U in FIG. 2, each of the bit cells 402L, 402U, 406L, and 406U includes the inactive area 232 between the storage circuit active area 210 and the read port active area 212. The inactive area 232 has the width $W_{232}$. The minimum width $W_{232}$ of the inactive array area 232 is 1.0 to 2.15 times the minimum fin pitch $P_{MIN}$.

FIG. 4 also includes a top-down plan view of 2×2 SRAM bit cell array circuit 426. The 2×2 array 426 includes bit cell pairs 428 and 430 that mirror each other across the mirror line 410. The bit cell pair 428 includes a bit cell 432L, and the bit cell pair 430 includes a bit cell 434L. Each of the bit cells 432L and 434L, includes a read port active area 420. An inactive array area 436 between the read port active area 420 in the bit cell 432L and the read port active area 420 in the bit cell 434L has a width $W_{436}$ that is greater than 2.15 times the minimum fin pitch $P_{MIN}$. Thus, the inactive array area 436 in the 2×2 array 426 is wider than the inactive array area 424 in the 2×2 array 400. In addition, the inactive bit cell areas 234 in the 2×2 array 426 are wider than the inactive bit cell areas 232 in the 2×2 array 400. Thus, a length $L_{400}$ of the 2×2 array 400 is less than a length $L_{426}$ of the 2×2 array 426 in FIG. 4. A large SRAM array (not shown) including the bit cell pairs 404 and 408 would, therefore, have a shorter length than if the large SRAM array included the bit cell pairs 428 and 430.

Figure 5:
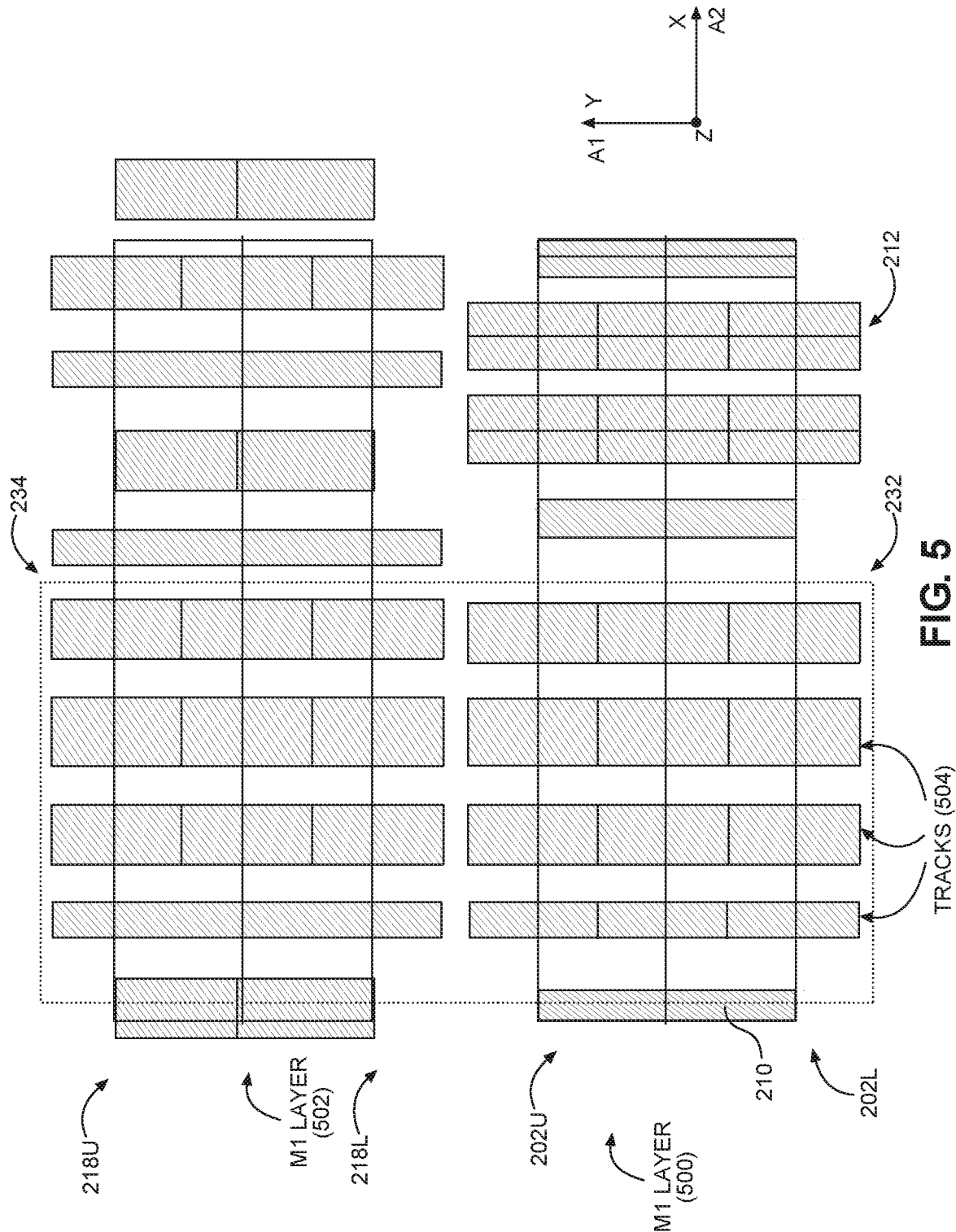
FIG. 5 is a top-down plan view of tracks in a first metal (M1) layer of the exemplary memory bit cell circuits in FIGS. 2 and 4.

FIG. 5 is a top-down plan view of an M1 layer 500 employed in the bit cells 202L, 202U and a top-down plan view of an M1 layer 502 employed in the bit cells 218L, 218U in FIG. 2. The M1 layers 500 and 502 include tracks 504 of metal extending in the first direction A1. In another exemplary aspect of the bit cell 202L, FIG. 5 shows that a number of the tracks 504 of the M1 layer 500 in the bit cell 202L is less than a number of the tracks 504 employed in the M1 layer 502 of the bit cell 218L in FIG. 2. Specifically, in the M1 layer 500, each of the bit cells 202L employs eight (8) of the tracks 504, and in the M1 layer 502, each of the bit cells 218L employs nine (9) of the tracks 504. With reference to FIG. 4, the M1 layer 500 includes no more than 8 of the tracks 504 in the 2×2 array 400 for each bit of the bit cells 402L, 402U, 406L, and 406U. Thus, in addition to having a reduced length $L_{400}$, the M1 layer 500 of the 2×2 array 400 has less congestion than the M1 layer 502 of the 2×2 array 426.

With further reference to FIG. 5, the M1 layer 500 in the storage circuit active areas 210 of the bit cells 202L, 202U has a same number of tracks 504 as the M1 layer 502 in the storage circuit active areas 210 of the bit cells 218L, 218U. However, the tracks 504 of the M1 layer 500 within the inactive area 232 and the read port active area 212 of the bit cell 202L have been reconfigured compared to the M1 layer 502 in the corresponding areas of the bit cells 218L, 218U. Where the M1 layer 502 of the bit cell 218L includes a track 504 for $V_{SS}$ (e.g., ground) in the inactive area 234 and another track 504 for $V_{SS}$ in the read port active area 212, the M1 layer 500 of the bit cell 202L employs just a single track 504 for $V_{SS}$. Due to the reduced width $W_{232}$ of the inactive area 232 in the bit cell 202L compared to the width $W_{234}$ of the inactive area 234 of the bit cell 218L, metal traces coupled to $V_{SS}$ extend a shorter distance in the second direction A2. Thus, one of the tracks 504 coupled to $V_{SS}$ in the M1 layer 502 of the bit cell 218L may be removed without causing grounding issues in the bit cell 202L.

Figure 6:
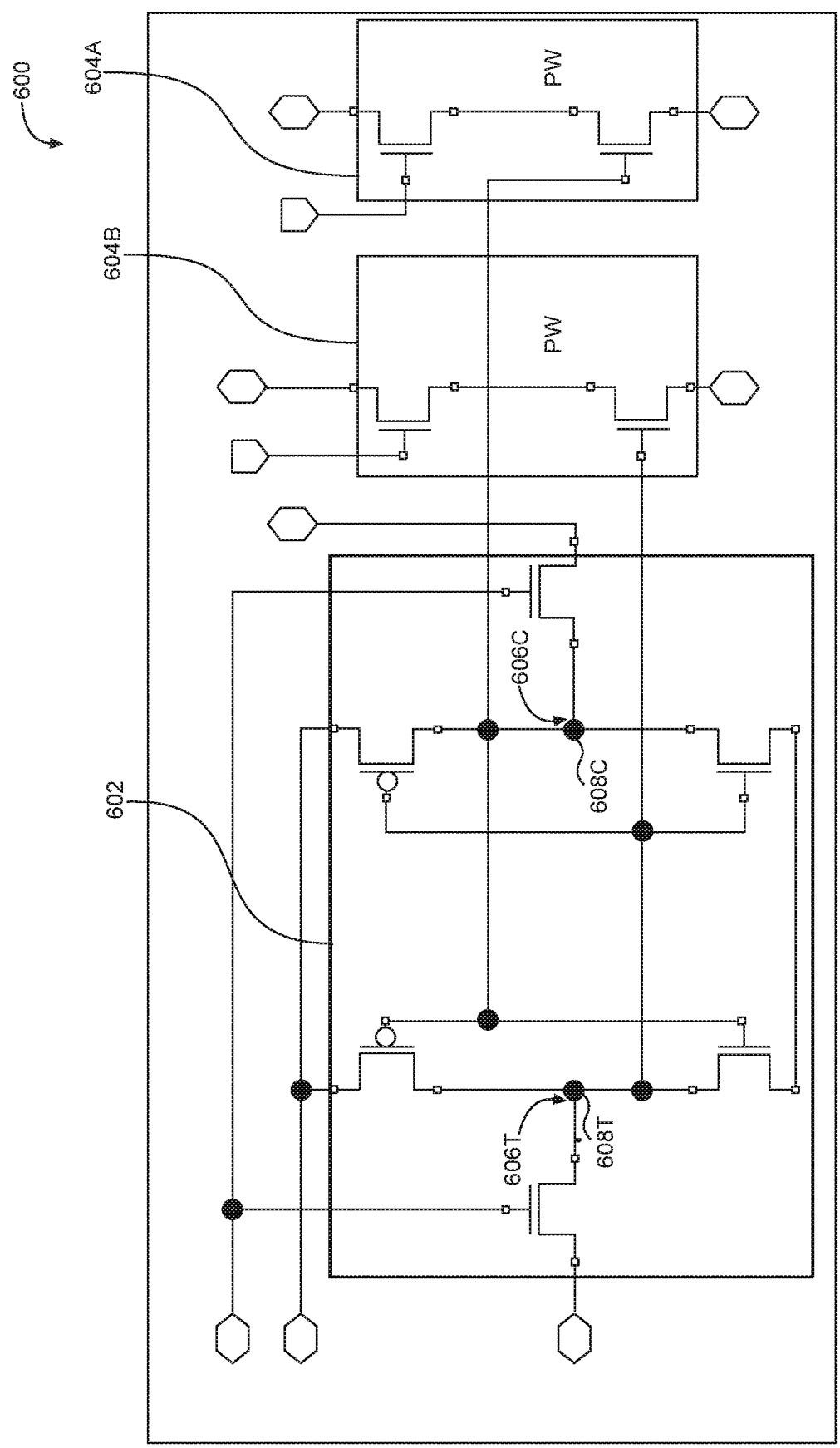
FIG. 6 is a circuit diagram of an SRAM bit cell circuit including a 6T storage circuit and two 2T read port circuits.

In another example including exemplary aspects disclosed herein, FIG. 6 is a circuit diagram of an SRAM bit cell circuit 600. The SRAM bit cell circuit ("bit cell") 600 includes a 6T SRAM storage circuit ("storage circuit") 602 and two (2) 2T read port circuits 604A and 604B. Thus, the bit cell 600 is a ten-transistor (10T) bit cell. The storage circuit 602 in FIG. 6 is identical to the storage circuit 102 in FIG. 1, and the read port circuit 604A is identical to the read port circuit 104 in FIG. 1. The read port circuit 604B in FIG. 6 is identical to the read port circuit 604A and operates in the same manner as the read port circuit 604A. However, the read port circuit 604A is configured to read a complement data value 606C from a complement data node 608C of the bit cell 600, and the read port circuit 604B is configured to read a true data value 606T from a true data node 608T.

Referring to the description of FIG. 1 above, the read operation of the SRAM bit cell circuit 100 includes a first step in which the RBL is pre-charged and a second step in which the RBL may be discharged or the charge is maintained, depending on whether the NET 122(0) is turned on by the voltage $V_{COMP}$ on the complement data node 1100.

Consequently, a read operation in the SRAM bit cell circuit 100 cannot be performed more often than once every other cycle of a processor clock. In contrast, in the bit cell 600 with the first read port circuit 604A coupled to the complement data node 608C and the second read port circuit 604B coupled to the true data node 608T, one of the true data value 606T and the complement data value 606C can be read every cycle in an alternating manner.

Figure 7:
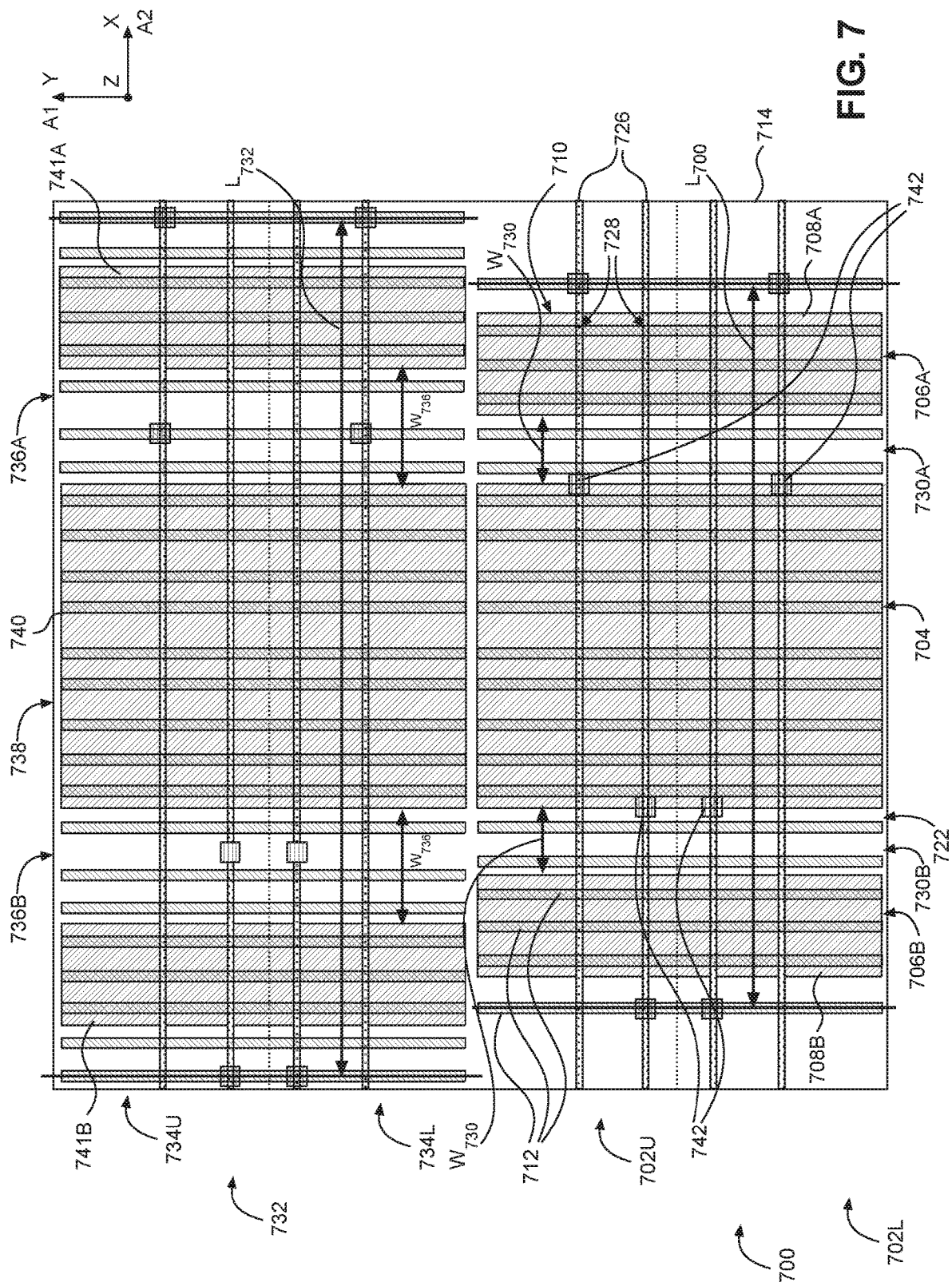
FIG. 7 is a top-down plan view comparing existing memory bit cell circuits with exemplary memory bit cell circuits such as the SRAM bit cell circuit of FIG. 6 including two minimized inactive bit cell areas and gate contacts overlapping an active area of a storage circuit to reduce a bit cell circuit length.

FIG. 7 is a top-down plan view of a bit cell pair 700 of bit cells 702L and 702U which are each implementations of the bit cell 600 in FIG. 6 and including the inventive aspects disclosed herein. The bit cell 702L includes a storage circuit 704 corresponding to the storage circuit 602. The bit cell 702L also includes two read port circuits 706A and 706B corresponding to the read port circuits 604A and 604B in FIG. 6. The read port circuit 706A includes a read port active area 708A disposed on a first side of the storage circuit 704 in the second direction A2, and the read port circuit 706B includes a read port active area 708B disposed on a second side of the storage circuit 704 in the second direction A2.

The bit cell pair 700 is implemented in FinFETs 710 in a plurality of fins 712 extending in the first direction A1 corresponding to the Y axis on a substrate 714. A minimum fin pitch $P_{MIN}$ (not shown) is a predetermined distance in the second direction A2, according to design rules. The minimum fin pitch $P_{MIN}$ is a minimum center-to-center distance of the fins 712, measured from the center (in the second direction) of a first fin to a center of a nearest adjacent fin, for example. The fins 712 in the bit cell pair 700 are separated by at least the minimum fin pitch $P_{MIN}$ or more. The storage circuit 704 includes a subset of the plurality of fins 712 disposed in a storage circuit active area 722. The read port circuits 706A and 706B each include a respective subset of the plurality of fins 712 disposed in read port active areas 708A and 708B, respectively. FIG. 7 also illustrates gates 726 extending in the second direction A2. The gates 726 extend over channel regions 728 to control the FinFETs 710.

The bit cell 702L includes a first inactive bit cell area 730A between the read port active area 708A of the read port circuit 706A and the storage circuit active area 722. The bit cell 702L, also includes a second inactive bit cell area 730B between the read port active area 708B and the storage circuit active area 722. Each of the first inactive bit cell area 730A and the second inactive bit cell area 730B has a width $W_{730}$. The minimum width from an active area to another active area, such as a width $W_{730}$ of the inactive bit cell area 730A from the storage circuit active area 722 to the read port circuit area 708A, is set as a multiple of the minimum allowed fin pitch $P_{MIN}$. The minimum width $W_{730}$ can be 1.0 to 2.15 times the minimum fin pitch $P_{MIN}$.

FIG. 7 also includes a top-down plan view of a bit cell pair 732 including bit cells 734L and 734U and does not implement the inventive aspects disclosed herein. The bit cells 734L and 734U in the bit cell pair 732 include first and second inactive bit cell areas 736A and 736B each having a width $W_{736}$. The bit cells 734L and 734U each include a storage circuit 738 in a storage circuit active area 740 identical to the storage circuit active area 722 in the bit cell 702L. However, the widths $W_{736}$ of the first and second inactive bit cell areas 736A and 736B are greater than the minimum width $W_{730}$ and greater than 2.15 times the minimum fin pitch $P_{MIN}$. Therefore, a length $L_{700}$ of the bit cell pair 700 in FIG. 7 is less than a length $L_{732}$ of the bit cell pair 732.

In another aspect, gate contacts 742 that vertically couple the gates 726 to metal layers (e.g., in a BEOL process) in the bit cell pair 700 are disposed at least partially over the storage circuit active area 722. At least a portion of an area of a gate contact 742 overlaps the storage circuit active area 722. The gate contacts 742 may entirely overlap (e.g., directly above) the storage circuit active area 722. Locating the gate contact 742 above, at least partially above, the storage circuit active area 722 allows the first and second inactive bit cell areas 730A and 730B to be smaller in width than the first and second inactive bit cell areas 736A and 736B of the bit cell pair 732.

Figure 8:
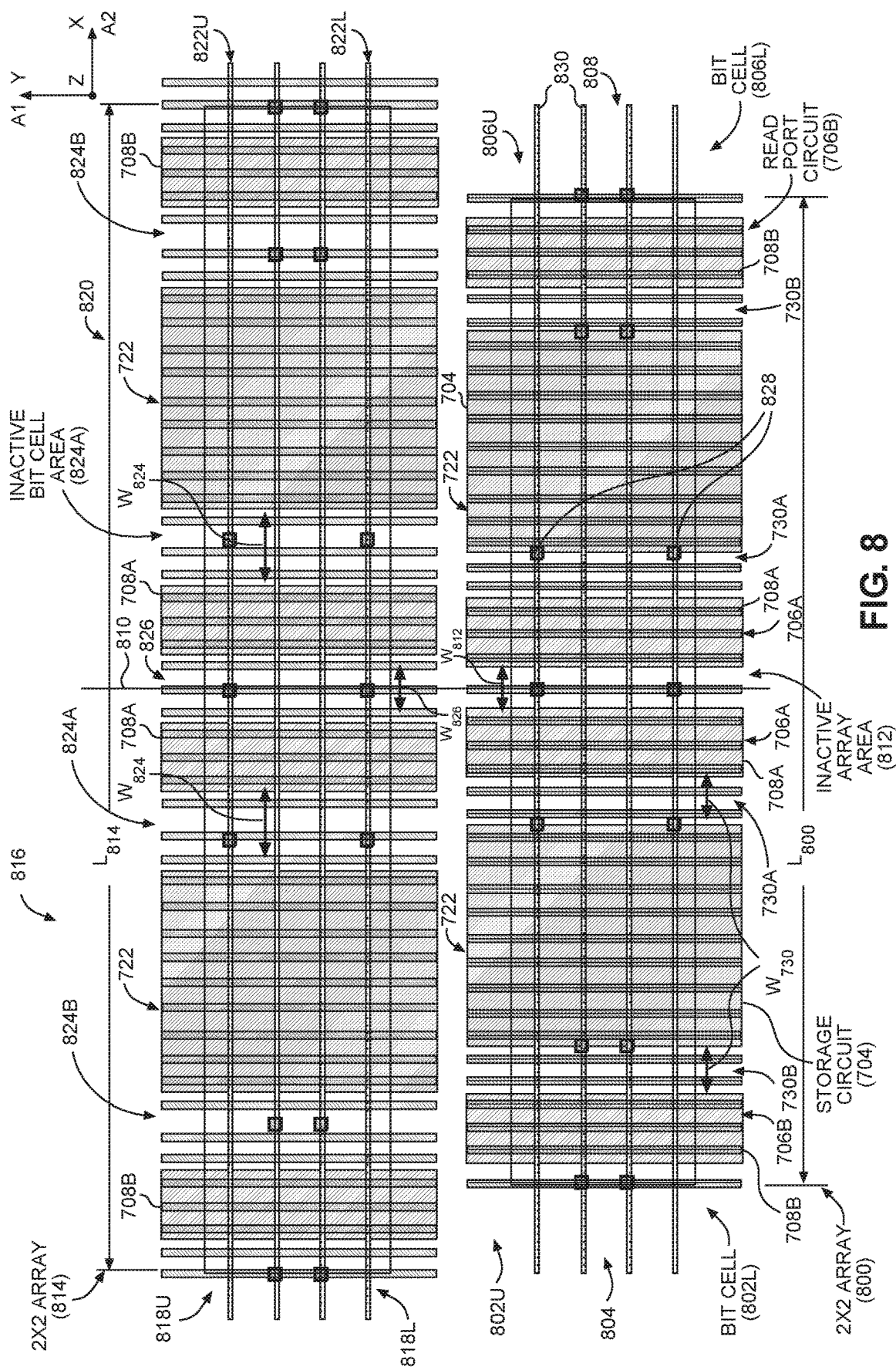
FIG. 8 is a top-down plan view of bit cell arrays of the memory bit cell circuits in FIG. 7.

FIG. 8 is a top-down plan view of an exemplary 2×2 SRAM bit cell array circuit ("2×2 array") 800 including bit cells 802L and 802U in a bit cell pair 804 corresponding to the bit cell pair 700 in FIG. 7. The 2×2 array 800 also includes bit cells 806L and 806U in a bit cell pair 808. The bit cell pair 808 mirrors the bit cell pair 804 across a mirror line 810 for optimized area efficiency of the 2×2 array 800. Each of the bit cells 802L, 802U, 806L, and 806U includes a storage circuit 704 in the storage circuit active area 722 and includes the read port circuits 706A and 706B in the read port active areas 708A and 708B, respectively. In the bit cell 802L, the read port circuit 706A is on a first side in the second direction A2 (i.e., closer to the mirror line 810) of the storage circuit 704 and the read port circuit 706B is on the second side, in the second direction A2, of the storage circuit 704. In the bit cell 806L, the read port circuit 706A is on a second side (i.e., closer to the mirror line 810) of the storage circuit 704 and the read port circuit 706B is on the first side, in the second direction A2, of the storage circuit 704. The mirror line 810 bisects an inactive array area 812 of the 2×2 array 800 between the read port active area 708A of the bit cell 802L and the read port active area 708A of the bit cell 806L. The minimum width from an active area to another active area, such as a width $W_{812}$ of the inactive array area 812 from the read port active area 708A of the bit cell 802L to the read port active area 708A of the bit cell 806L is set as a multiple of the minimum allowed fin pitch $P_{MIN}$. The minimum width $W_{812}$ can be 1.0 to 2.15 times the minimum fin pitch $P_{MIN}$ allowed by design rules.

FIG. 8 also includes a top-down plan view of a 2×2 array circuit 814. The 2×2 array 814 includes a bit cell pair 816 with bit cells 818L and 818U, and a bit cell pair 820 with bit cells 822L and 822U. Each of the bit cells 818L, 818U, 822L, and 822U includes a read port active area 708A and a read port active area 708B on opposite sides of a storage circuit active area 722. In addition, each of the bit cells 818L, 818U, 822L, and 822U includes first and second inactive bit cell areas 824A and 824B that correspond to the first and second inactive bit cell areas 730A and 730B. However, the first and second inactive bit cell areas 730A and 730B have a width $W_{730}$ (between 1.0 and 2.15 times $P_{MIN}$), whereas the first and second inactive bit cell areas 824A and 824B of the 2×2 array 814 each have a width $W_{824}$ (e.g., between the read port active areas 708A and 708B and the storage circuit active areas 722) that is greater than 2.15 times the minimum fin pitch $P_{MIN}$.

Further, the mirror line 810 bisects an inactive array area 826 of the 2×2 array 814 between the read port active area 708A of the bit cell 818L and the read port active area 708A of the bit cell 822L. A width $W_{826}$, in the second direction A2, of the inactive array area 826 from the read port active area 708A of the bit cell 818L to the read port active area 708A of the bit cell 822L is also greater than 2.15 times the minimum fin pitch $P_{MIN}$.

Comparing the 2×2 array 800 to the 2×2 array 814, the width $W_{826}$ of the inactive array area 826 in the 2×2 array 814 is greater than the width $W_{812}$ of the inactive array area 812 in the 2×2 array 800. In addition, the widths $W_{824}$ of the first and second inactive bit cell areas 824A and 824B are greater than the widths $W_{730}$ of the first and second inactive bit cell areas 730A and 730B. Due to these combined differences, a length $L_{800}$ of the 2×2 array 800 is significantly less than a length $L_{814}$ of the 2×2 array 814, as illustrated in FIG. 8.

As discussed above, the 2×2 array 800 also includes gate contacts 828 that vertically couple to gates 830 in FIG. 8 and an area of the gate contacts 828 in each of the bit cells 802L, 802U, 806L, and 806U at least partly overlaps the corresponding storage circuit active area 722.

Figure 9:
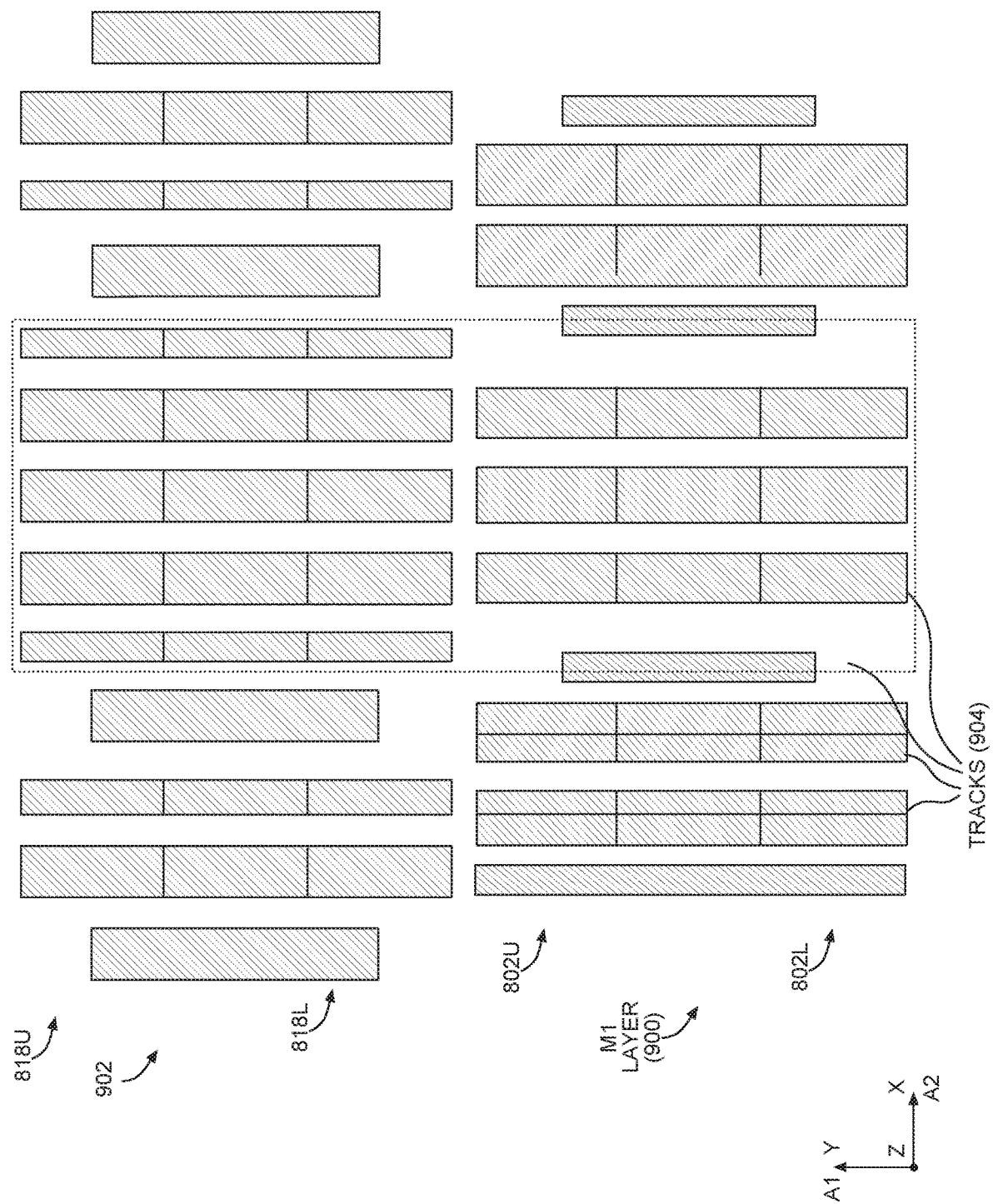
FIG. 9 is a top-down plan view of tracks of a first metal (M1) layer of the exemplary memory bit cell circuits in FIGS. 7 and 8.

FIG. 9 is a top-down plan view of an M1 layer 900 employed in the bit cells 802L, 802U and a top-down plan view of an M1 layer 902 employed in the bit cells 818L, 818U in FIG. 8. The M1 layers 900 and 902 include tracks 904 of metal extending in the first direction A1. In another exemplary aspect, a number of the tracks 904 of the M1 layer 900 of the bit cell 802L is less than a number of the tracks 904 employed in the M1 layer 902 of the bit cell 818L. Specifically, the M1 layer 900 of the bit cell 802L employs ten (10) of the tracks 904 and the M1 layer 902 of the bit cell 8181, employs twelve (12) of the tracks 904. With reference to FIG. 9, the M1 layer 900 includes no more than 10 of the tracks 904 in the 2×2 array 800 for each bit of the bit cells 802L and 802U. Thus, in addition to having a reduced length $L_{800}$, another improvement of the 2×2 array 800 over the 2×2 array 814 is that the M1 layer 900 is less congested than the M1 layer 902.

Figure 10:
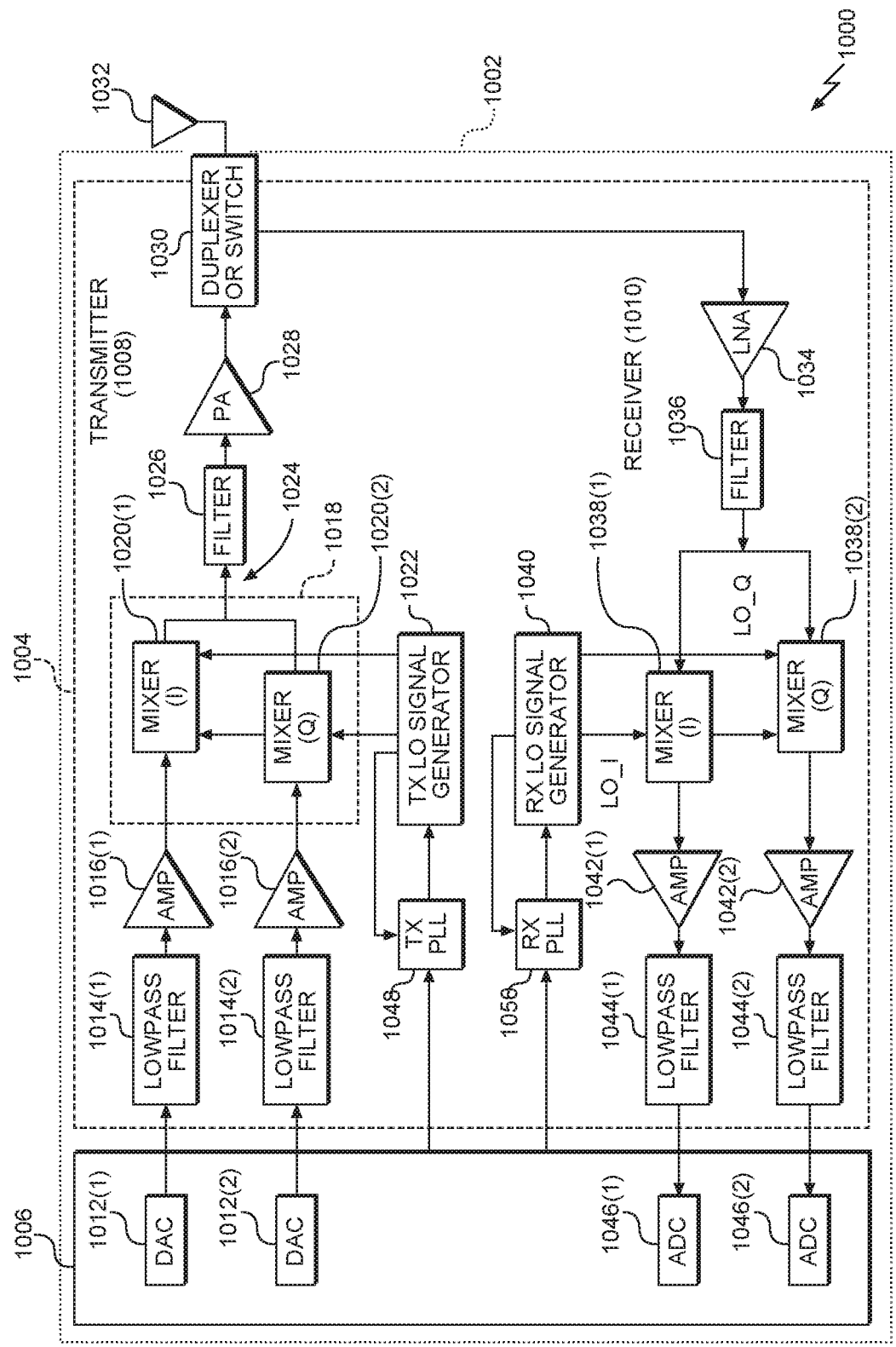
FIG. 10 is a block diagram of an exemplary wireless communications device that includes a radio frequency (RF) module such as the bit cell arrays in FIGS. 4 and 8.

FIG. 10 illustrates an exemplary wireless communications device 1000 that includes radio frequency (RF) components formed from one or more integrated circuits (ICs) 1002, wherein any of the ICs 1002 can include an SRAM bit cell array including minimized inactive bit cell areas, minimized inactive array areas, and gate contacts overlapping storage circuit active areas to reduce a length of the array, as illustrated in any of FIGS. 4 and 8, and according to any of the aspects disclosed herein. The wireless communications device 1000 may include or be provided in any of the above-referenced devices, as examples. As shown in FIG. 10, the wireless communications device 1000 includes a transceiver 1004 and a data processor 1006. The data processor 1006 may include a memory to store data and program codes. The transceiver 1004 includes a transmitter 1008 and a receiver 1010 that support bi-directional communications. In general, the wireless communications device 1000 may include any number of transmitters 1008 and/or receivers 1010 for any number of communication systems and frequency bands. All or a portion of the transceiver 1004 may be implemented on one or more analog ICs, RFICs, mixed-signal ICs, etc.

The transmitter 1008 or the receiver 1010 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for the receiver 1010. In the direct-conversion architecture, a signal is frequency-converted between RF and baseband in one stage. The super-heterodyne and direct-conversion architectures may use different circuit blocks and/or have different requirements. In the wireless communications device 1000 in FIG. 10, the transmitter 1008 and the receiver 1010 are implemented with the direct-conversion architecture.

In the transmit path, the data processor 1006 processes data to be transmitted and provides 1 and Q analog output signals to the transmitter 1008. In the exemplary wireless communications device 1000, the data processor 1006 includes digital-to-analog converters (DACs) 1012(1), 1012 (2) for converting digital signals generated by the data processor 1006 into the I and Q analog output signals, e.g., I and Q output currents, for further processing.

Within the transmitter 1008, lowpass filters 1014(1), 1014(2) filter the I and Q analog output signals, respectively, to remove undesired signals caused by the prior digital-to-analog conversion. Amplifiers (AMPs) 1016(1), 1016(2) amplify the signals from the lowpass filters 1014(1), 1014 (2), respectively, and provide I and Q baseband signals. An upconverter 1018 upconverts the I and Q baseband signals with I and Q transmit (TX) local oscillator (LO) signals through mixers 1020(1), 1020(2) from a TX LO signal generator 1022 to provide an upconverted signal 1024. A filter 1026 filters the upconverted signal 1024 to remove undesired signals caused by the frequency upconversion as well as noise in a receive frequency band. A power amplifier (PA) 1028 amplifies the upconverted signal 1024 from the filter 1026 to obtain the desired output power level and provides a transmit RF signal. The transmit RF signal is routed through a duplexer or switch 1030 and transmitted via an antenna 1032.

In the receive path, the antenna 1032 receives signals transmitted by base stations and provides a received RF signal, which is routed through the duplexer or switch 1030 and provided to a low noise amplifier (LNA) 1034. The duplexer or switch 1030 is designed to operate with a specific receive (RX)-to-TX duplexer frequency separation, such that RX signals are isolated from TX signals. The received RF signal is amplified by the LNA 1034 and filtered by a filter 1036 to obtain a desired RF input signal. Down-conversion mixers 1038(1), 1038(2) mix the output of the filter 1036 with I and Q RX LO signals (i.e., LO_I and LO_Q) from an RX LO signal generator 1040 to generate I and Q baseband signals. The I and Q baseband signals are amplified by AMPs 1042(1), 1042(2) and further filtered by lowpass filters 1044(1), 1044(2) to obtain I and Q analog input signals, which are provided to the data processor 1006. In this example, the data processor 1006 includes analog-to-digital converters (ADCs) 1046(1), 1046(2) for converting the analog input signals into digital signals to be further processed by the data processor 1006.

In the wireless communications device 1000 of FIG. 10, the TX LO signal generator 1022 generates the I and Q TX LO signals used for frequency upconversion, while the RX signal generator 1040 generates the I and Q RX LO signals used for frequency downconversion. Each LO signal is a periodic signal with a particular fundamental frequency. A TX phase-locked loop (PLL) circuit 1048 receives timing information from the data processor 1006 and generates a control signal used to adjust the frequency and/or phase of the TX LO signals from the TX LO signal generator 1022. Similarly, an RX PLL circuit 1050 receives timing information from the data processor 1006 and generates a control signal used to adjust the frequency and/or phase of the RX LO signals from the RX LO signal generator 1040.

Wireless communications devices 1000 that each include an SRAM bit cell array including minimized inactive bit cell areas, minimized inactive array areas, and gate contacts overlapping storage circuit active areas to reduce a length of the array, as illustrated in any of FIGS. 4 and 8, and according to any of the aspects disclosed herein, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 11:
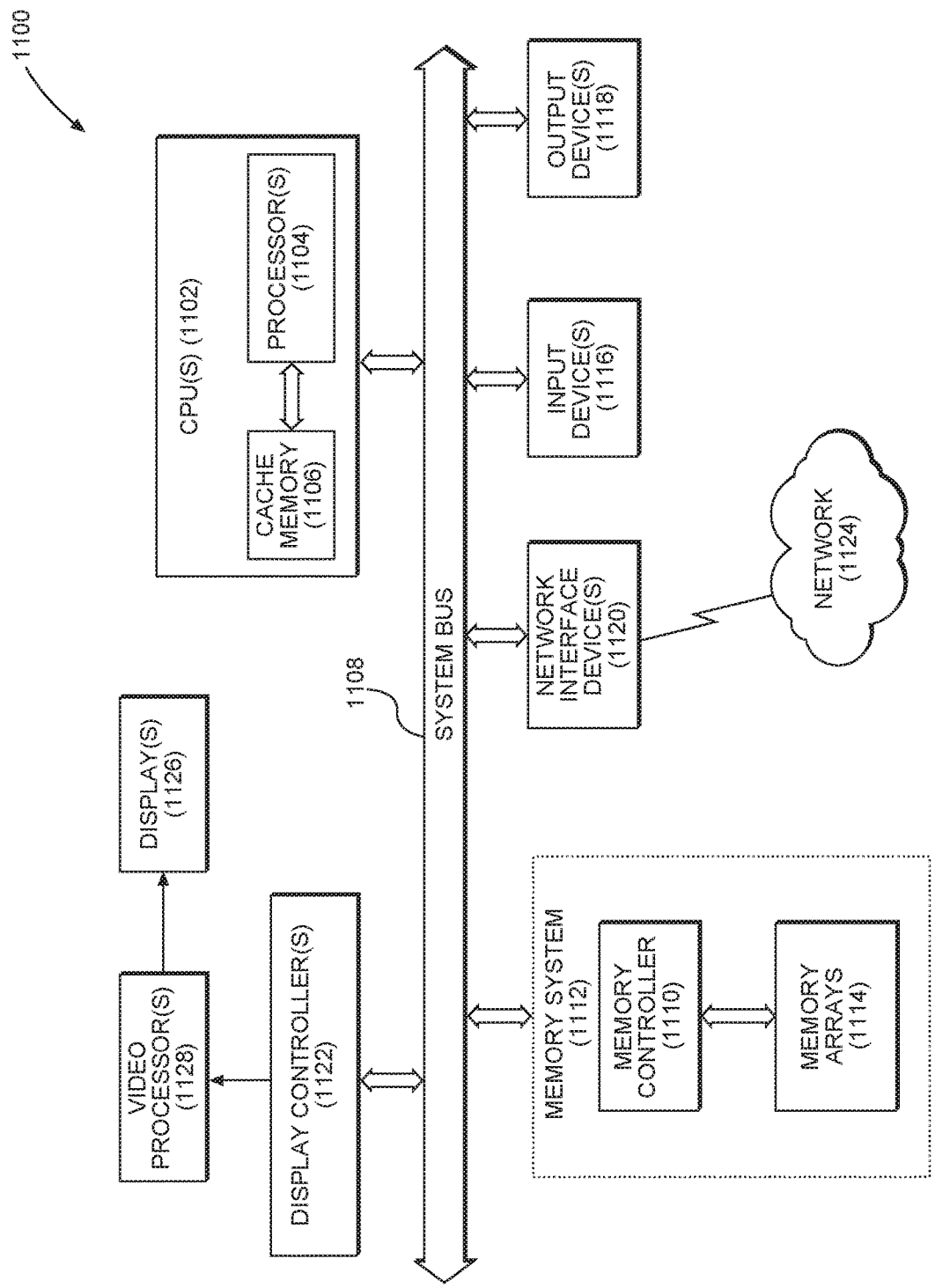
FIG. 11 is a block diagram of an exemplary processor-based system that includes an SRAM bit cell array including minimized inactive bit cell areas, minimized inactive array areas, and gate contacts overlapping storage circuit active areas to reduce a length of the array, as illustrated in any of FIGS. 4 and 8, and according to any of the aspects disclosed herein.

In this regard, FIG. 11 illustrates an example of a processor-based system 1100 including an SRAM bit cell array including minimized inactive bit cell areas, minimized inactive array areas, and gate contacts overlapping storage circuit active areas to reduce a length of the array, as illustrated in any of FIGS. 4 and 8, and according to any aspects disclosed herein. In this example, the processor-based system 1100 includes one or more central processor units (CPUs) 1102, which may also be referred to as CPU or processor cores, each including one or more processors 1104. The CPU(s) 1102 may have cache memory 1106 coupled to the processor(s) 1104 for rapid access to temporarily stored data. As an example, the processor(s) 1104 could include an SRAM bit cell array including minimized inactive bit cell areas, minimized inactive array areas, and gate contacts overlapping storage circuit active areas to reduce a length of the array, as illustrated in any of FIGS. 4 and 8, and according to any aspects disclosed herein. The CPU(s) 1102 is coupled to a system bus 1108 and can intercouple master and slave devices included in the processor-based system 1100. As is well known, the CPU(s) 1102 communicates with these other devices by exchanging address, control, and data information over the system bus 1108. For example, the CPU(s) 1102 can communicate bus transaction requests to a memory controller 1110 as an example of a slave device. Although not illustrated in FIG. 11, multiple system buses 1108 could be provided, wherein each system bus 1108 constitutes a different fabric.

Other master and slave devices can be connected to the system bus 1108. As illustrated in FIG. 11, these devices can include a memory system 1112 that includes the memory controller 1110 and one or more memory arrays 1114, one or more input devices 1116, one or more output devices 1118, one or more network interface devices 1120, and one or more display controllers 1122, as examples. Each of the memory system 1112, the one or more input devices 1116, the one or more output devices 1118, the one or more network interface devices 1120, and the one or more display controllers 1122 can include an SRAM bit cell array including minimized inactive bit cell areas, minimized inactive array areas, and gate contacts overlapping storage circuit active areas to reduce a length of the array, as illustrated in any of FIGS. 4 and 8, and according to any of the aspects disclosed herein. The input device(s) 1116 can include any type of input device, including, but not limited to, input keys, switches, voice processors, etc. The output device(s) 1118 can include any type of output device, including, but not limited to, audio, video, other visual indicators, etc. The network interface device(s) 1120 can be any device configured to allow exchange of data to and from a network 1124. The network 1124 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1120 can be configured to support any type of communications protocol desired.

The CPU(s) 1102 may also be configured to access the display controller(s) 1122 over the system bus 1108 to control information sent to one or more displays 1126. The display controller(s) 1122 sends information to the display(s) 1126 to be displayed via one or more video processors 1128, which process the information to be displayed into a format suitable for the display(s) 1126. The display(s) 1126 can include any type of display, including, but not limited to, a cathode ray tube (CRT), a liquid crystal display (LCD), a plasma display, a light emitting diode (LED) display, etc. The display controller(s) 1122, display(s) 1126, and/or the video processor(s) 1128 can include an SRAM bit cell array including minimized inactive bit cell areas, minimized inactive array areas, and gate contacts overlapping storage circuit active areas to reduce a length of the array, as illustrated in any of FIGS. 4 and 8, and according to any of the aspects disclosed herein.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein but is to be accorded the widest scope consistent with the principles and novel features disclosed herein.

What is claimed is:

1. A memory bit cell circuit comprising:
a substrate;
a first plurality of fins extending in a first direction on the substrate, wherein a smallest center-to-center distance from a first fin to a nearest adjacent fin of the first plurality of fins, in a second direction orthogonal to the first direction, is a minimum fin pitch;
a storage circuit configured to store a data value, the storage circuit comprising a storage circuit active area of the substrate, the storage circuit active area comprising a first subset of the first plurality of fins;
a read port circuit configured to read the data value, the read port circuit comprising a read port active area of the substrate; the read port active area comprising a second subset of the first plurality of fins; and
an inactive area between the storage circuit active area and the read port active area,
wherein a width of the inactive area in the second direction from the storage circuit active area to the read port active area is between 1.0 and 2.15 times the minimum fin pitch.

2. The memory bit cell circuit of claim 1, wherein the width of the inactive area is between forty five (45) nanometers (nm) and fifty five (55) nm.

3. The memory bit cell circuit of claim 1, wherein the smallest center-to-center distance from the first fin to the nearest adjacent fin is a predetermined distance.

4. The memory bit cell circuit of claim 1, wherein the storage circuit further comprises:
a write access Fin Field-Effect Transistor (FET) (FinFET) configured to supply the data value to the storage circuit, the write access FinFET comprising a first gate; and
a first gate contact vertically coupled to the first gate, the first gate contact comprising an area in a vertical interconnect layer disposed above the first gate,
wherein at least a portion of the area of the first gate contact overlaps the storage circuit active area.

5. The memory bit cell circuit of claim 4, wherein an entire area of the first gate contact is above the storage circuit active area.

6. The memory bit cell circuit of claim 1, wherein the inactive area comprises a non-diffusion region.

7. The memory bit cell circuit of claim 1, wherein the inactive area comprises at least one inactive fin.

8. The memory bit cell circuit of claim 1; wherein:
the storage circuit is configured to store a true data value and a complement data value;
the read port circuit comprises a first read port circuit configured to read the complement data value;
the first read port circuit comprises a first read port active area of the substrate disposed on a first end of the storage circuit in the second direction; and
the memory bit cell circuit further comprises a second read port circuit configured to read the true data value, the second read port circuit comprising a second read port active area of the substrate on a second end of the storage circuit in the second direction, the second read port active area comprising a third subset of the first plurality of fins.

9. The memory bit cell circuit of claim 1, wherein:
the storage circuit active area comprises one or more of a P-type diffusion region and an N-type diffusion region; and
the read port active area comprises one or more of a P-type diffusion region and an N-type diffusion region.

10. The memory bit cell circuit of claim 1, wherein:
the storage circuit comprises a six-transistor (6T) static random access memory (SRAM) bit cell circuit; and
the read port circuit comprises a two-transistor (2T) read port circuit.

11. A memory bit cell array circuit comprising:
a substrate;
a first memory bit cell circuit comprising:
a first plurality of fins extending in a first direction on the substrate, wherein a smallest center-to-center distance from a first fin to a nearest adjacent fin of the first plurality of fins, in a second direction orthogonal to the first direction, is a minimum fin pitch;
a first storage circuit configured to store a first data value, the first storage circuit comprising a first storage circuit active area of the substrate, the first storage circuit active area comprising a first subset of the first plurality of fins; and
a first read port circuit configured to read the first data value, the first read port circuit comprising a first read port active area of the substrate, the first read port active area comprising a second subset of the first plurality of fins,
wherein the first read port circuit is on a first side of the first storage circuit in the second direction;
a second memory bit cell circuit comprising:
a second plurality of fins extending in the first direction on the substrate;
a second storage circuit configured to store a second data value, the second storage circuit comprising a second storage circuit active area of the substrate, the second storage circuit active area comprising a first subset of the second plurality of fins; and
a second read port circuit configured to read the second data value, the second read port circuit comprising a second read port active area of the substrate, the second read port active area comprising a second subset of the second plurality of fins,
wherein the second read port circuit is on a second side of the second storage circuit in the second direction; and
an inactive array area between the first read port circuit and the second read port circuit, wherein a width of the inactive array area from the first read port active area to the second read port active area is between 1.0 and 2.15 times the minimum fin pitch.

12. The memory bit cell array circuit of claim 11, wherein:
the first memory bit cell circuit further comprises a first inactive bit cell area between the first read port active area and the first storage circuit active area;
a width of the first inactive bit cell area in the second direction is between 1.0 and 2.15 times the minimum fin pitch;
the second memory bit cell circuit further comprises a second inactive bit cell area between the second read port active area and the second storage circuit active area; and
a width of the second inactive bit cell area in the second direction is between 1.0 and 2.15 times the minimum fin pitch.

13. The memory bit cell array circuit of claim 11, wherein:
the first memory bit cell circuit further comprises a first write access Fin Field-Effect Transistor (FET) (FinFET) configured to supply the first data value to the first storage circuit, the first write access FinFET comprising a first gate;
a first gate contact is vertically coupled to the first gate, the first gate contact comprising a first area in a vertical interconnect layer disposed above the first gate; and
at least a portion of the first area of the first gate contact overlaps the first storage circuit active area.

14. The memory bit cell array circuit of claim 13, wherein:
the second memory bit cell circuit further comprises a second write access FinFET configured to supply the second data value to the second storage circuit, the second write access FinFET comprising a second gate;
a second gate contact is vertically coupled to the second gate, the second gate contact comprising a second area in a vertical interconnect layer disposed above the second gate; and
at least a portion of the second area of the second gate contact overlaps the second storage circuit active area.

15. The memory bit cell array circuit of claim 14, wherein the first area of the first gate contact is entirely overlapping the first storage circuit active area; and
the second area of the second gate contact is entirely overlapping the second storage circuit active area.

16. The memory bit cell array circuit of claim 11, further comprising a first metal (M1) layer comprising:
eight tracks of metal extending in the first direction coupled to the first memory bit cell circuit; and
eight tracks of metal extending in the first direction coupled to the second memory bit cell circuit.

17. The memory bit cell array circuit of claim 11, wherein:
the first storage circuit is configured to store a first true data value and a first complement data value;
the second storage circuit is configured to store a second true data value and a second complement data value;
the first read port circuit is configured to read one of the first true data value and the first complement data value;
the second read port circuit is configured to read one of the second true data value and the second complement data value;
the first memory bit cell circuit further comprises a third read port circuit configured to read the other one of the first true data value and the first complement data value, the third read port circuit comprising a third read port active area disposed on a second side of the first storage circuit in the second direction; and
the second memory bit cell circuit further comprises a fourth read port circuit configured to read the other one of the second true data value and the second complement data value, the fourth read port circuit comprising a fourth read port active area disposed on a first side of the second storage circuit in the second direction.

18. The memory bit cell array circuit of claim 17, further comprising a first metal (M1) layer comprising:
ten tracks of metal extending in the first direction coupled to the first memory bit cell circuit; and
ten tracks of metal extending in the first direction coupled to the second memory bit cell circuit.

19. The memory bit cell array circuit of claim 11, wherein the width of the inactive array area is between forty five (45) nanometers (nm) and fifty five (55) nm.

20. The memory bit cell array circuit of claim 11 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (MID) player; a portable digital video player; an automobile; a vehicle component; avionics systems; a drone; and a multicopter.

21. A method of making a memory bit cell array circuit, the method comprising:
forming a substrate;
forming a first memory bit cell circuit comprising:
a first plurality of fins extending in a first direction on the substrate, wherein a smallest center-to-center distance from a first fin to a nearest adjacent fin of the first plurality of fins, in a second direction orthogonal to the first direction, is a minimum fin pitch;
a first storage circuit configured to store a first data value, the first storage circuit comprising a first storage circuit active area of the substrate, the first storage circuit active area comprising a first subset of the first plurality of fins; and
a first read port circuit configured to read the first data value, the first read port circuit comprising a first read port active area of the substrate, the first read port active area comprising a second subset of the first plurality of fins,
wherein the first read port circuit is on a first side of the first storage circuit in the second direction;
forming a second memory bit cell circuit comprising:
a second plurality of fins extending in the first direction on the substrate;
a second storage circuit configured to store a second data value, the second storage circuit comprising a second storage circuit active area of the substrate, the second storage circuit active area comprising a first subset of the second plurality of fins; and
a second read port circuit configured to read the second data value, the second read port circuit comprising a second read port active area of the substrate, the second read port active area comprising a second subset of the second plurality of fins,
wherein the second read port circuit is on a second side of the second storage circuit in the second direction; and
forming an inactive array area between the first read port circuit and the second read port circuit, wherein a width of the inactive array area from the first read port active area to the second read port active area is between 1.0 and 2.15 times the minimum fin pitch.

* * * * *